(12) United States Patent
Fornara

(10) Patent No.: US 8,835,923 B2
(45) Date of Patent: Sep. 16, 2014

(54) PROTECTION METHOD FOR AN ELECTRONIC DEVICE AND CORRESPONDING DEVICE

(75) Inventor: Pascal Fornara, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 13/616,603

(22) Filed: Sep. 14, 2012

(65) Prior Publication Data

US 2013/0075726 A1     Mar. 28, 2013

(30) Foreign Application Priority Data

Sep. 22, 2011   (FR) .................................... 11 58451

(51) Int. Cl.
| | | |
|---|---|---|
| *H01L 29/10* | (2006.01) | |
| *H01L 21/66* | (2006.01) | |
| *H01L 21/30* | (2006.01) | |
| *H01L 21/31* | (2006.01) | |
| *H01L 23/58* | (2006.01) | |

(52) U.S. Cl.
CPC .................................... H01L 23/585 (2013.01)
USPC ................ 257/48; 438/17; 438/458; 438/765

(58) Field of Classification Search
CPC ............................ H01L 23/585; H01L 23/544
USPC ............................ 257/48; 326/8; 438/17, 458
See application file for complete search history.

(56) References Cited

U.S. PATENT DOCUMENTS

| | | | |
|---|---|---|---|
| 4,203,780 A * | 5/1980 | Matsushita et al. ........... | 438/530 |
| 4,816,421 A | 3/1989 | Dynes et al. | |
| 5,359,219 A | 10/1994 | Hwang | |
| 5,387,555 A | 2/1995 | Linn et al. | |
| 5,985,739 A | 11/1999 | Plettner et al. | |
| 6,232,645 B1 | 5/2001 | Belot | |
| 6,285,071 B1 | 9/2001 | Belot | |
| 6,344,125 B1 * | 2/2002 | Locke et al. ................... | 205/118 |
| 6,391,752 B1 | 5/2002 | Colinge et al. | |
| 6,404,643 B1 * | 6/2002 | Chung .......................... | 361/737 |
| 6,919,618 B2 | 7/2005 | Aumueller et al. | |
| 7,632,739 B2 | 12/2009 | Hebras | |
| 7,736,993 B2 | 6/2010 | Allibert et al. | |
| 8,389,380 B2 | 3/2013 | Hebras | |
| 8,587,063 B2 | 11/2013 | Dennard et al. | |

(Continued)

FOREIGN PATENT DOCUMENTS

| | | |
|---|---|---|
| EP | 0553853 A2 | 8/1993 |
| EP | 2306518 A1 | 4/2011 |

(Continued)

OTHER PUBLICATIONS

Maex et al. entitled "Formation of ultra-thin buried CoSi2 layers by ion implantation in (100) Si", Applied Surface Science, 53, Apr. 23, 1991, pp. 273-277.

(Continued)

*Primary Examiner* — Long K Tran
*Assistant Examiner* — Dzung Tran
(74) *Attorney, Agent, or Firm* — Slater & Matsil, L.L.P.

(57) ABSTRACT

The semiconductor wafer for a silicon-on-insulator integrated circuit comprises an insulating region located between a first semiconductor substrate intended to receive the integrated circuit and a second semiconductor substrate containing at least one buried layer comprising at least one metal silicide.

31 Claims, 3 Drawing Sheets

(56) References Cited

U.S. PATENT DOCUMENTS

| | | |
|---|---|---|
| 8,609,533 B2 | 12/2013 | Scheiper et al. |
| 8,643,110 B2 | 2/2014 | Gonzalez et al. |
| 2001/0045593 A1* | 11/2001 | De Leeuw et al. ............ 257/314 |
| 2002/0115262 A1* | 8/2002 | Cabral et al. .................. 438/404 |
| 2003/0057522 A1* | 3/2003 | Francis et al. ................. 257/566 |
| 2004/0079993 A1 | 4/2004 | Ning et al. |
| 2004/0180512 A1* | 9/2004 | Linn et al. ..................... 438/458 |
| 2005/0040500 A1* | 2/2005 | Henmi .......................... 257/659 |
| 2007/0072391 A1 | 3/2007 | Pocas et al. |
| 2009/0102024 A1* | 4/2009 | Takahi et al. ................. 257/629 |

FOREIGN PATENT DOCUMENTS

| | | | | |
|---|---|---|---|---|
| FR | 2864336 A1 | 6/2005 | | |
| FR | 2896618 A1 | 7/2007 | | |
| FR | 2922360 A1 | 4/2009 | | |
| JP | 11-250215 | * | 9/1999 | ........... G06K 19/077 |

OTHER PUBLICATIONS

Wu et al., entitled "Formation of buried CoSi2 layers by ion implantation and their stability at high temperatures" Applied Surface Sciences, 38, Mar. 19, 1989, pp. 217-224.

French Search Report received in Application No. 1158451 mailed Apr. 19, 2012, 9 pages.

* cited by examiner

PROTECTION METHOD FOR AN ELECTRONIC DEVICE AND CORRESPONDING DEVICE

This application claims priority to French Patent Application No. 1158451, which was filed on Sep. 22, 2011 and is incorporated herein by reference.

TECHNICAL FIELD

Generally, the invention relates to electronic circuits, and more particularly to the protection of a secure integrated circuit from a fault-injection attack. The invention is advantageously, but not limitingly, applicable to smart cards and to the protection of the confidential data that they contain.

BACKGROUND

Among possible attacks used by fraudsters to extract confidential data from a memory of an integrated circuit, for example a protected memory of a smart card, mention may be made of differential fault analysis (DFA) attacks, which attempt to disrupt the operation and/or the content of the memory, or even to modify the logic of the circuit, for example by means of a radiation (laser, infrared, X-ray, etc.) beam.

Such a radiation beam may be emitted through the front side of the chip. To protect against such an attack, the front side of the chip is generally equipped with a particularly dense metal grid forming a protective screen and intended to absorb most of the energy of the laser beam. Moreover, this grid is electrically connected to certain components of the integrated circuit, thereby allowing the integrity thereof to be regularly monitored, in case the attacker tries to remove at least part of this grid.

Such a radiation beam may also be emitted through the back side of the chip. It is therefore particularly desired to protect the electronic circuit from a back-side laser attack.

SUMMARY OF THE INVENTION

In one aspect, embodiments of the present invention provide for a semiconductor wafer for a silicon-on-insulator integrated circuit. The wafer includes an insulating region located between a first semiconductor substrate intended to receive at least one integrated circuit, and a second semiconductor substrate, characterized in that the second semiconductor substrate contains at least one buried layer comprising at least one metal silicide.

In another aspect, embodiments of the present invention provide for a process for protecting from a back-side radiation attack at least one integrated circuit in and on a first semiconductor substrate of a silicon-on-insulator wafer. The process includes forming an insulating region between the first semiconductor substrate; and a second semiconductor substrate, and forming at least one buried layer by forming a metal silicide in the second semiconductor substrate before the at least one integrated circuits is produced in and on the first semiconductor substrate.

In yet another aspect, embodiments of the present invention provide for a method of forming a device oxidizing at least a first major surface of a first substrate, forming thereby a first oxide layer, and implanting atoms into a silicon substrate, the atoms selected from the group consisting essentially of elements that form a silicide with silicon. The method further includes bonding the first oxide layer of the first substrate to the second substrate, and heating the silicon substrate at a temperature sufficient to cause formation of a buried silicide layer between the implanted atoms and the silicon substrate.

BRIEF DESCRIPTION OF THE DRAWINGS

Other advantages and features of the invention will become clear on examining the detailed description of non-limiting methods of implementation and embodiments and the appended drawings, in which.

DETAILED DESCRIPTION OF ILLUSTRATIVE EMBODIMENTS

Figure 1:
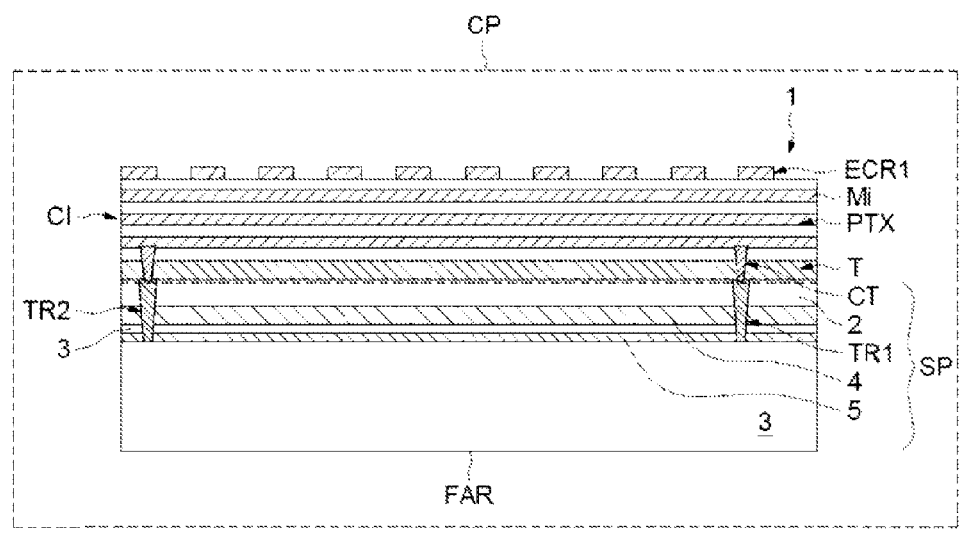
FIGS. 1 to 3 schematically illustrate various embodiments of a semiconductor wafer and a device according to the invention.

Before addressing the illustrated embodiments in detail, embodiments of the present invention and advantageous features thereof will be discussed generally. Generally, embodiments of the present invention provide for defense of an integrated circuit. One defence against such an attack consists in using silicon-on-insulator (SOI) substrates.

More precisely, such a semiconductor wafer comprises an insulating region located between a first semiconductor substrate, generally a rather thin layer, intended to receive the integrated circuit, and a second semiconductor substrate.

The insulating region is generally made of silicon oxide. This oxide layer may, in certain cases, attenuate the radiation beam and diffract it, thus making laser fault injection more difficult.

According to one method of implementation and embodiment, it is proposed to make it even more difficult to attack an electronic circuit, mounted on an SOI substrate, using a radiation beam, for example a laser beam, from the back side, i.e. through the second semiconductor substrate.

According to one aspect, a process is provided for protecting from a back-side radiation attack at least one integrated circuit in and on a first semiconductor substrate of a silicon-on-insulator wafer, comprising an insulating region located between the first semiconductor substrate and a second semiconductor substrate.

According to a general feature of this aspect, at least one buried layer comprising at least one metal silicide is produced in the second semiconductor substrate before the one or more integrated circuits are produced. Thus this buried layer forms a metallic barrier to back-side laser attacks.

The fact that the buried layer is produced in the semiconductor wafer before the components of the integrated circuit are produced allows the buried layer to be positioned at the desired depth in the second semiconductor substrate, for example as close as possible to the insulating region of the SOI wafer and therefore as close as possible to the one or more integrated circuits, and this occurs without running the risk of interfering with the production of the one or more integrated circuits while permitting, after the integrated circuits have been produced on the wafer, the wafer to be thinned, for example to 140 microns and less, before dicing of the wafer.

According to one method of implementation, production of said at least one buried layer comprises implanting metal atoms into the second substrate and forming the metal silicide during the thermal bonding of the second substrate and the insulating region secured to the first substrate.

Thus it is not necessary to provide a specific diffusion anneal to form the metal silicide from the metal atoms implanted in the silicon. The heat treatment used to bond the second substrate and the insulating region (silicon oxide layer for example) secured to the first substrate also allows the metal silicide to be formed.

Moreover, the step of implanting metal atoms not only allows the depth of the buried layer to be easily adjusted, but also allows this layer to be easily produced with any desired form.

Thus it is possible to produce said at least one buried layer in the vicinity of the insulating region, thereby making any attempt to disrupt the integrity of this layer, for example by abrasion from the back side, more difficult, and in particular in the form of at least one serpentine pattern, thereby making attack with a laser beam more difficult.

The metal silicide is advantageously chosen to be thermally stable up to a temperature limit higher than or equal to the maximum temperature of a fabrication step of the integrated circuit, typically annealing steps. This temperature limit depends on the technological features of the fabrication process of the integrated circuit used.

Thus currently, thermal anneals used during the fabrication of the components of the integrated circuit may be carried out at temperatures possibly reaching about 900° C. to 1000° C. In this case it is for example possible to use cobalt silicide (CoSi2). This being so, other metal silicides may be used, such as for example WSi2, MoSi2, TaSi2, etc. When fabrication technologies employing lower temperature anneals are used, NiSi or PtSi may be used, for example.

This being so, it has been observed that a buried metal silicide is thermally stable up to a higher temperature than the same metal silicide formed conventionally on the surface of a silicon substrate.

According to another aspect, a semiconductor wafer is provided for a silicon-on insulator integrated circuit, comprising an insulating region located between a first semiconductor substrate intended to receive the integrated circuit and a second semiconductor substrate.

According to a general feature of this aspect, the second semiconductor substrate contains at least one buried layer comprising at least one metal silicide. At least one part of this buried layer may advantageously be located in the vicinity of the insulating region, and for example form at least one serpentine pattern.

According to another aspect, an electronic device is provided, comprising an integrated circuit borne by the first semiconductor substrate of the semiconductor wafer such as defined above.

According to one embodiment, the device furthermore comprises at least two deep trench vias respectively connected between two different locations on said at least one buried layer and the integrated circuit, and control means connected to said deep trench vias and configured to monitor the integrity of said at least one semiconductor region.

Thus, in the case of abrasion from the back side, aiming to remove all or part of this buried layer before the laser attack is carried out, its integrity can be checked by the control means, for example by measuring the resistance of the semiconductor region or else by measuring capacitance effects between parts of the buried layer in order to detect any coupling of two portions of the buried layer that could have been cut through before reconnecting the circuit.

Once the attack has been detected, there are many ways, depending on the application, either to block the component or to prevent sensitive data from being read, or to reset the component, etc.

According to another aspect, a smart card is provided incorporating an electronic device such as defined above.

Turning now to the illustrated embodiments, in FIG. 1, the reference 1 denotes an electronic device comprising an integrated circuit CI produced in and on a silicon-on-insulator (SOI) semiconductor wafer SP. The integrated circuit is for example all or part of a smart card CP microprocessor.

The semiconductor wafer SP comprises an insulating region 4, typically made of silicon dioxide, located between a first semiconductor substrate 2, generally a thin film of silicon intended to receive the integrated circuit CI, and a second semiconductor substrate 3, for example a silicon substrate.

The integrated circuit CI comprises components, in the conventional way, for example transistors T, produced in and on the substrate 2. This integrated circuit part is known by those skilled in the art as the FEOL (front end of line) part. The integrated circuit also comprises an interconnect part PTX, also known by those skilled in the art as the BEOL (back end of line) part.

The interconnect part is used to interconnect the various components to one another and comprises, in the conventional way, metallic tracks produced within various metallization levels Mi of the integrated circuit, some of these metallic tracks being connected by vias between the metallization levels.

The second semiconductor substrate 3 here comprises, as illustrated in FIG. 1, at least one buried layer 5 comprising at least one metal silicide, here cobalt silicide CoSi2.

This buried layer is here located in the vicinity of and under the insulating region, for example the buried layer is between 50 nm and 500 nm distant from the insulating region. Locating the buried layer in the vicinity of the insulating region allows this layer to be as close as possible to the integrated circuit, thereby making it easy to thin the semiconductor wafers to ultra-thin thickness before they are diced.

Figure 2:
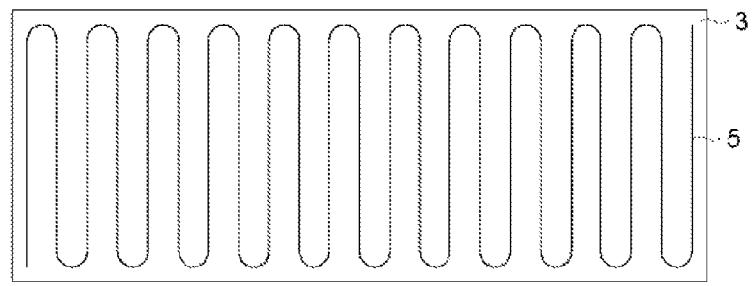

Although this buried layer may take any possible form, it is particularly advantageous, in particular when it must be connected to the integrated circuit in order to allow its integrity to be monitored, that it may take a form that allows the current flowing through it to be interrupted when it is damaged. In this respect, this buried layer may take the form of a relatively tightly wound serpentine pattern 5 (FIG. 2).

Thus, if the back side FAR of the substrate is abraded so that this buried layer is reached, rupture of the latter between the two trench vias TR1 and TR2 interrupts the current flow through it, thereby allowing the attempted attack to be detected.

As illustrated in FIG. 1, the integrated circuit CI here comprises, on its front side, a metal screen ECR1 connected to control means located in the FEOL part of the integrated circuit and configured to monitor its integrity, for example by detecting interruption of current flow in this screen ECR1. The screen ECR1 is connected to the FEOL part of the integrated circuit by way of the (BEOL) interconnect part PTX.

It is particularly advantageous, as illustrated in FIG. 1, to connect the buried layer 5 to metallic tracks of the interconnect part PTX so as to be able to electrically connect this buried layer to the screen ECR1. Thus, the means that allow the integrity of the screen ECR1 to be monitored may also be used to monitor the integrity of the buried layer 5. This is the reason why the trench vias TR1 and TR2 advantageously make contact with two different locations on the buried layer 5.

Figure 3:
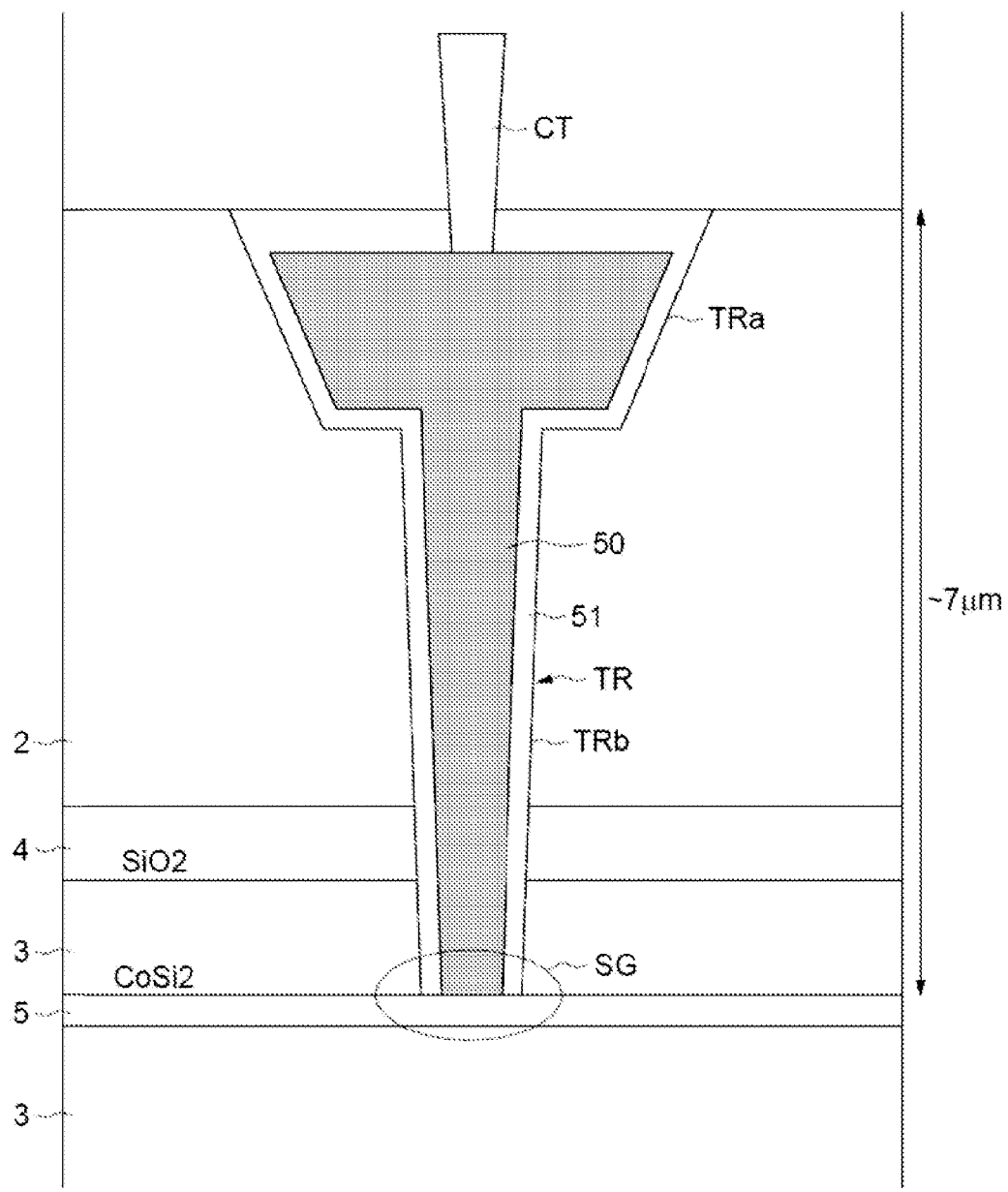

Such a trench via TR is illustrated in greater detail in FIG. 3. The following is an exemplary embodiment.

First a shallow trench TRa (of the type used in shallow trench isolation (STI)) is produced in the substrate 2, then the etching operation is continued, in the conventional way, known per se, in order to produce a deep trench TRb that passes through the substrate 2, the buried insulating layer 4 and the substrate 3, and stops on the buried layer 5.

Next, on the sides of the trench TRa and the trench TRb, an insulating layer 51, for example a silicon-dioxide layer, is grown, or otherwise formed, such as by deposition.

Next, the bottom of the trench TRb is overetched SG in order to remove the insulating layer 51 at the bottom of the trench TRb so as to allow electrical contact to subsequently be made with the buried layer 5. Such an overetch SG is for example a highly anisotropic dry etch allowing the oxide at the bottom of the trench to be removed while leaving behind the oxide 51 on the sides of the trench TR.

Next, the rest of the trenches TRa and TRb are filled with a conductive material, for example highly doped polysilicon 50, which makes contact with the buried layer 5.

Next, after the trench TRa has been passivated with silicon dioxide, a contact CT is produced, in the conventional way, in order to form an electrical connection between the polysilicon 50 and a metallic track of the interconnect part PTX.

An exemplary embodiment of a semiconductor wafer SP according to the invention will now be described in more detail with reference more particularly to FIG. 4. The "Smart-cut" process may be used in part for example. More precisely, all the sides of a silicon wafer A are oxidized in order to form silicon dioxide 4 on these sides. Next, ions are implanted IMP1 in this wafer A, so as to form a rupture line LC.

Moreover, metal atoms, for example cobalt atoms, are implanted in another semiconductor wafer B (implantation IMP2). An implanted zone LIM is thus obtained inside the semiconductor wafer B.

Next, oxidized and implanted wafer A is flipped and bonded to implanted semiconductor wafer B. This bonding operation RC is carried out at a high temperature and also allows the metal silicide, in this case cobalt silicide, to be formed at the same time.

Formation of such a buried layer of cobalt silicide is already well known per se to those skilled in the art. The reader may in particular refer to the article by Karen Maex et al. entitled "Formation of ultra-thin buried CoSi2 layers by ion implantation in (100) Si", Applied Surface Science 53 (1991) 273-277 or else to the article by Wu et al., entitled "Formation of buried CoSi2 layers by ion implantation and their stability at high temperatures" Applied Surface Sciences 38 (1989) 217-224. These two articles show the feasibility of producing such a layer and its stability at high temperatures.

Producing the buried layer by implantation of metal atoms not only allows the depth of the buried layer in the substrate 3 to be easily adjusted, but also allows this buried layer to be easily given any desired form.

Figure 4:
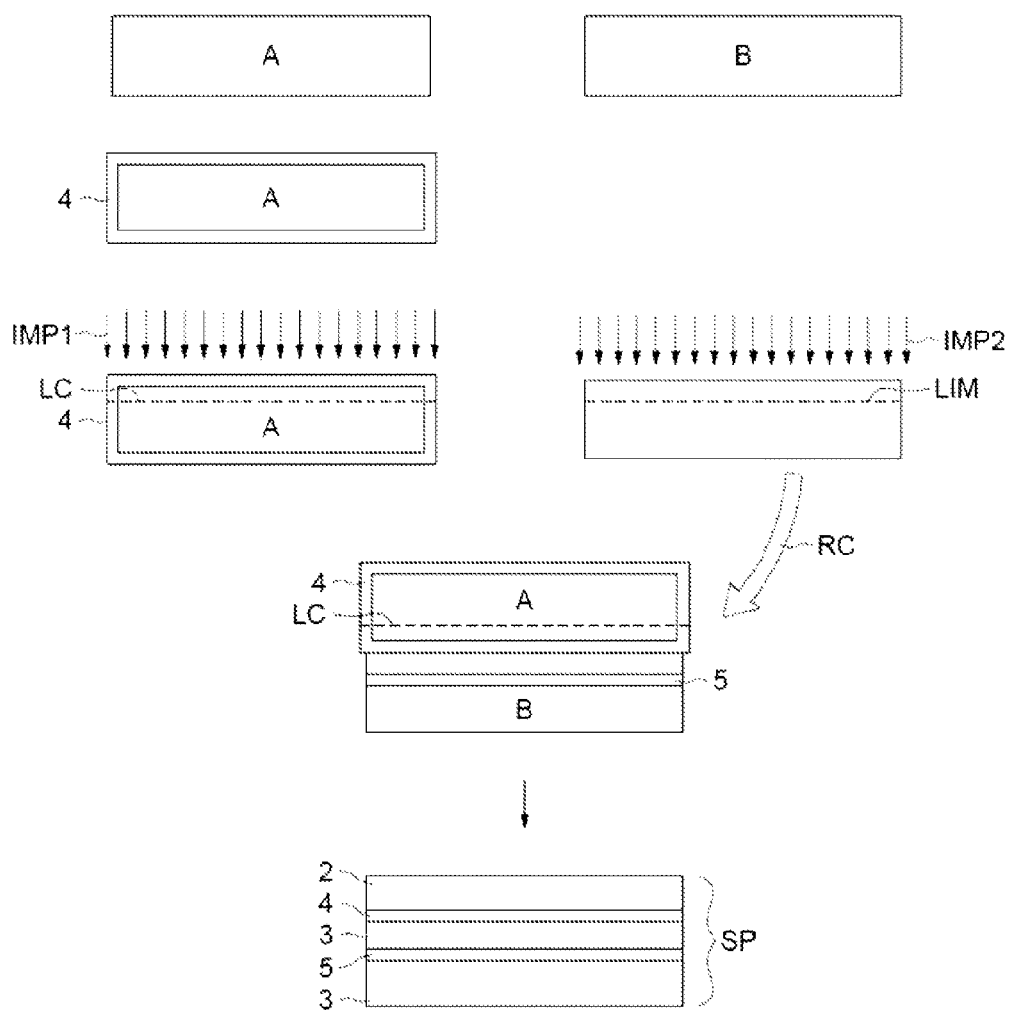
FIG. 4 schematically illustrates an example of how a semiconductor wafer according to the invention might be obtained.

Next, as illustrated in the bottom part of FIG. 4, the initial wafer A is cleaved along the rupture line LC, in order to obtain the semiconductor wafer SP.

It will be noted here that the buried metal-silicide layer is thus produced before the FEOL part and the BEOL part of the integrated circuit have been produced, meaning that these production steps are not disrupted. Furthermore, the presence of the insulating layer 4 of the SOI substrate prevents any contamination of the integrated circuit by the constituents of the buried layer 5.

After the various integrated circuits have been produced in and on this wafer, the wafer is generally thinned before being diced so as to singulate the various chips.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

What is claimed is:

1. A process comprising:
providing a first semiconductor substrate;
providing a second semiconductor substrate;
forming an insulating region on one or both of the first semiconductor substrate and the second semiconductor substrate;
forming a buried layer by implanting metal atoms into the second semiconductor substrate;
thermally bonding the first semiconductor substrate to the second semiconductor substrate so that the insulating layer is between the first semiconductor substrate and the second semiconductor substrate;
forming a metal silicide during the thermal bonding; and
forming integrated circuitry at a surface of the first semiconductor substrate after bonding the first semiconductor substrate to the second semiconductor substrate.

2. The process according to claim 1, wherein the metal silicide is thermally stable up to a temperature limit higher than or equal to a maximum temperature of all fabrication steps used when forming the integrated circuitry.

3. The process according to claim 1, wherein the metal silicide is cobalt silicide.

4. The process according to claim 1, wherein the buried layer is formed in the vicinity of the insulating region.

5. The process according to claim 1, wherein the buried layer includes a serpentine pattern.

6. A method of forming a device, the method comprising:
oxidizing a first major surface of a semiconductor substrate, forming thereby a first oxide layer;
implanting atoms into a silicon substrate;
placing the first oxide layer of the semiconductor substrate in contact with the silicon substrate; and
heating the silicon substrate to bond the first oxide layer of the semiconductor substrate to the silicon substrate and to form a buried silicide layer between the implanted atoms and the silicon substrate.

7. The method of claim 6 wherein oxidizing the first major surface of the semiconductor substrate comprises performing a process selected from the group consisting of growing an oxide, spinning on an oxide, and depositing an oxide.

8. The method of claim 6 wherein implanting atoms into the silicon substrate comprises implanting atoms selected from the group consisting of W, Mo, Ta, Ni, Pt, and combinations thereof.

9. The method of claim 6 wherein heating the silicon substrate causes the first oxide layer of the semiconductor substrate to be bonded to the silicon substrate and the buried silicide layer to be formed simultaneously.

10. The method of claim 6 further comprising:
implanting impurities into the semiconductor substrate to form a rupture line therein; and cleaving the semiconductor substrate along the rupture line.

11. The method of claim 6 further comprising:
forming an integrated circuit on the semiconductor substrate, the integrated circuit including at least one conductive interconnect line and at least one conductive via; and
forming a screen layer above the integrated circuit.

12. The method of claim 11 further comprising electrically interconnecting the screen layer to the buried silicide layer through the at least one conductive via.

13. The method of claim 12 further comprising forming at least two conductive vias electrically connected to two respective portions of the buried silicide layer and electrically monitoring an integrity of the buried silicide layer.

14. The method of claim 6, wherein implanting atoms into a silicon substrate comprises implanting cobalt atoms.

15. The method of claim 6 further comprising forming an integrated circuit on the semiconductor substrate after heating the silicon substrate.

16. A method of forming a device, the method comprising:
implanting metal atoms into a silicon substrate to a depth from a top surface of the silicon substrate, the metal atoms being implanted in a patterned manner;
forming an insulating layer on a first surface of at least one of the silicon substrate and a second substrate;
bonding together the insulating layer of the at least one of the silicon substrate and the second substrate, the bonding performed at a temperature so that a patterned silicide is formed between the implanted metal atoms and the silicon substrate; and
forming an integrated circuit in and on a second surface of the second substrate.

17. The method of claim 16 further comprising:
forming a trench via by
forming a trench extending through the second substrate and into the silicon substrate;
lining the trench with an insulating liner; and
filling the trench with a conductor, wherein the conductor electrically contacts the patterned silicide; and
forming an interconnect over the second surface of the second substrate; and
electrically contacting the trench via conductor to the interconnect.

18. The method of claim 16 wherein forming the insulating layer comprises oxidizing the first surface of the second substrate prior to the bonding step.

19. The method of claim 16 wherein the depth from the top surface of the silicon substrate is about 50 nm to about 500 nm from the first surface of the silicon substrate.

20. The method of claim 16 further comprising thinning the silicon substrate from a second surface after the bonding step.

21. The method of claim 16 further comprising:
forming a radiation screen over the integrated circuit.

22. The method of claim 16 wherein the patterned silicide includes a serpentine pattern.

23. The method of claim 16 wherein the second substrate is a silicon wafer and wherein forming an insulating layer on a first surface of at least one of the silicon substrate and the second substrate comprises oxidizing surfaces of the silicon wafer to form silicon dioxide on said surfaces.

24. The method of claim 16 further comprising integrating the bonded silicon substrate and second substrate into a smart card package.

25. A method of forming a semiconductor device including a silicon-on-insulator integrated circuit, the method comprising:
providing a semiconductor wafer comprising an insulating region between a first semiconductor substrate and a second semiconductor substrate, wherein the second semiconductor substrate contains a buried metal silicide layer; and
forming an integrated circuit in the first semiconductor substrate of the semiconductor wafer, wherein the insulating region is between the integrated circuit and the buried metal silicide layer.

26. The method of claim 25, wherein forming the integrated circuit comprises heating the semiconductor wafer to a maximum fabrication temperature, wherein the metal silicide is thermally stable up to the maximum fabrication temperature.

27. The method of claim 25, wherein the metal silicide is cobalt silicide.

28. The method of claim 25, wherein the buried metal silicide layer includes a serpentine pattern.

29. The method of claim 25, further comprising forming a plurality of deep trench vias, each deep trench via connected between the buried metal silicide layer and the integrated circuit.

30. The method of claim 29, further comprising forming a controller in the first semiconductor substrate and coupled to the deep trench vias, the controller configured to monitor the integrity of the buried layer.

31. The method of claim 25, wherein further comprising forming a metallic protective screen on a front side of the wafer, the screen being electrically connected to the buried metal silicide layer, wherein the integrated circuit is between the metallic protective screen and the insulating region.

* * * * *